United States Patent
Torti et al.

(10) Patent No.: US 6,635,883 B2
(45) Date of Patent: Oct. 21, 2003

(54) GAS CLUSTER ION BEAM LOW MASS ION FILTER

(75) Inventors: Richard P. Torti, Burlington, MA (US); Jerald P. Dykstra, Austin, TX (US)

(73) Assignee: Epion Corporation, Billerica, MA (US)

( * ) Notice: Subject to any disclaimer, the term of this patent is extended or adjusted under 35 U.S.C. 154(b) by 389 days.

(21) Appl. No.: 09/727,810

(22) Filed: Dec. 1, 2000

(65) Prior Publication Data

US 2001/0033128 A1 Oct. 25, 2001

Related U.S. Application Data

(60) Provisional application No. 60/169,345, filed on Dec. 6, 1999.

(51) Int. Cl.⁷ .......................... H01J 49/26; H01J 37/317
(52) U.S. Cl. .................. 250/423 R; 250/424; 250/251; 250/492.1; 250/492.21; 250/298; 315/111.61; 315/111.01
(58) Field of Search .............................. 250/423 R, 424, 250/251, 492.1, 492.21, 298; 315/111.61, 111.01

(56) References Cited

U.S. PATENT DOCUMENTS

| | | | |
|---|---|---|---|
| 4,737,637 A | * 4/1988 | Knauer | 250/281 |
| 5,185,287 A | 2/1993 | Aoyagi et al. | |
| 5,459,326 A | 10/1995 | Yamada | |
| 5,576,538 A | 11/1996 | Sakai et al. | |
| 5,668,368 A | 9/1997 | Sakai et al. | |
| 5,814,194 A | 9/1998 | Deguchi et al. | |
| 6,087,615 A | 7/2000 | Schork et al. | |
| 6,331,227 B1 | * 12/2001 | Dykstra et al. | 156/345.29 |
| 6,359,286 B1 | * 3/2002 | Ito et al. | 250/492.21 |
| 6,486,478 B1 | * 11/2002 | Libby et al. | 250/492.1 |

FOREIGN PATENT DOCUMENTS

| | | |
|---|---|---|
| JP | 62-112777 | 5/1987 |
| JP | 03-245523 | 11/1991 |

OTHER PUBLICATIONS

N. Kofuji, et al., Development of gas cluster source and its characteristics, Proc. 14$^{th}$ Symp. On Ion Sources and ion Assisted Technology, Tokyo (1991) p. 15.

Yamada & Matsuo, Cluster ion beam processing, Matl. Science in Semiconductor Processing I, (1998) pp. 27–41.

M.S. Livingston, et al., *Particle Accelerators*, p. 242, eqn. (8–5), McGraw–Hill, New York (1962).

* cited by examiner

*Primary Examiner*—Nikita Wells
(74) *Attorney, Agent, or Firm*—Perkins, Smith & Cohen LLP; Jerry Cohen; Jacob N. Erlich

(57) ABSTRACT

Incorporating the use of a permanent magnet within a GCIB apparatus to separate undesirable monomer ions from a gas cluster ion beam to facilitate improved processing of workpieces. In an alternate embodiment, the effect of the permanent magnet may be controlled by the use of an electrical coil. The above system eliminates problems related to power consumption and heat generation.

10 Claims, 11 Drawing Sheets

GAS CLUSTER ION BEAM LOW MASS ION FILTER

CROSS REFERENCE TO RELATED APPLICATIONS

This application claims priority of the U.S. Provisional Application Ser. No. 60/169,345 filed Dec. 6, 1999 entitled GAS CLUSTER ION BEAM LOW MASS ION FILTER.

BACKGROUND OF THE INVENTION

This invention relates generally to gas cluster ion beam (GCIB) processing equipment, and, more particularly to incorporating means within GCIB processing equipment for eliminating monomer ions from the ion cluster beam without the production of unwanted heat.

The use of gas cluster ion beams for etching, cleaning, and smoothing of material surfaces is known in the art(see for example Deguchi et al., U.S. Pat. No. 5,814,194). For purposes of better understanding the present invention, gas clusters are nano-sized aggregates of materials that are gaseous under conditions of standard temperature and pressure. Such clusters typically consist of aggregates of~several tens to~several thousand atoms or molecules loosely bound to form the cluster. Such clusters can be ionized by electron bombardment or other means, permitting them to be formed into directed beams of known and controllable energy. The larger sized clusters are the most useful because of their ability to carry substantial energy per cluster ion, while having modest energy per atom or molecule. The clusters disintegrate on impact, with each individual atom or molecule carrying only a small fraction of the total cluster energy. Consequently the impact effects of large clusters are substantial, but are limited to a very shallow surface region. This makes ion clusters effective for a variety of surface modification processes, without the tendency to produce deeper subsurface damage characteristic of monomer ion beam processing.

Means for creation of and acceleration of such GCIB are described in the reference previously cited. Presently available ion cluster sources produce clusters ions having a wide distribution of sizes, N (where N=the number atoms or molecules in each cluster).

Because monomer ions as well as cluster ions are produced by presently available cluster ion beam sources, those monomer ions are accelerated and transported to the workpiece being processed along with the cluster ions. Upon acceleration in an electric field, monomers, having low mass, obtain high velocities that allow the light monomers to penetrate the surface of the workpiece and produce deep damage which is likely to be detrimental to the intended process. Such sub-surface ion damage is well-established and well-known from the more traditional monomer ion beam processing art and can produce a wide variety of deep damage and implantation.

It is also known in the ion cluster beam art that many GCIB processes benefit from incorporating means within GCIB processing equipment for eliminating monomer ions from the ion cluster beams. Electrostatic and electromagnetic mass analyzers have been employed to remove light ions from the beam of heavier clusters (see Knauer, U.S. Pat. No. 4,737,637 and Aoyanagi et al. in Japanese laid open application JP 03-245523A1 corresponding to Japanese application JP 2-43090, cited as prior art in Aoyagi et al., U.S. Pat. No. 5,185,287). Electrostatic and electromagnetic mass analyzers have also been employed to select ion clusters having a narrow range of ion masses from a beam containing a wider distribution of masses (see Knauer, U.S. Pat. No. 4,737,637 and Aoki, Japanese laid open application JP 62-112777A1).

In the past, electromagnetic beam filters have been used to separate ion masses. However, electromagnets are costly and, while in use, continually consume electrical power. Furthermore, the electrical power is converted to heat. Since the magnetic beam filter must be deployed in a vacuum chamber, namely the ionization/acceleration chamber, convection cooling of the beam filter is not practical. Generally, conductive paths to water or other fluid cooling systems must be provided and heat exchangers are required to remove heat from the cooling fluid and transfer it to the environment. Such cooling apparatus adds additional cost and introduces maintenance problems. The use of an electromagnetic beam filter is undesirable for these and other reasons.

It is therefore an object of this invention to reduce the heat produced in GCIB processing equipment and to eliminate the need for water or other cooling of a beam filter device.

It is a further object of this invention to separate undesired monomer ions from the GCIB.

It is still a further object of this invention to reduce the cost, weight, and maintenance complexity of a GCIB processing system

SUMMARY OF THE INVENTION

The objects set forth above as well as further and other objects and advantages of the present invention are achieved by the embodiments of the invention described hereinbelow.

The present invention is capable of reducing the heat produced in GCIB processing equipment, thus eliminating the need for water or other cooling of a beam filter device utilized therein. The invention utilizes a permanent magnet beam filter or a hybrid permanent electromagnetic beam filter to separate undesired monomer ions from the GCIB. Consequently the present invention substantially reduces the cost, weight, and maintenance complexity of a GCIB processing system over GCIB systems which incorporate a conventional electromagnetic beam filter system therein.

For a better understanding of the present invention, together with other and further objects thereof, reference is made to the accompanying drawings and detailed description.

DETAILED DESCRIPTION OF THE PREFERRED EMBODIMENTS

Figure 1:
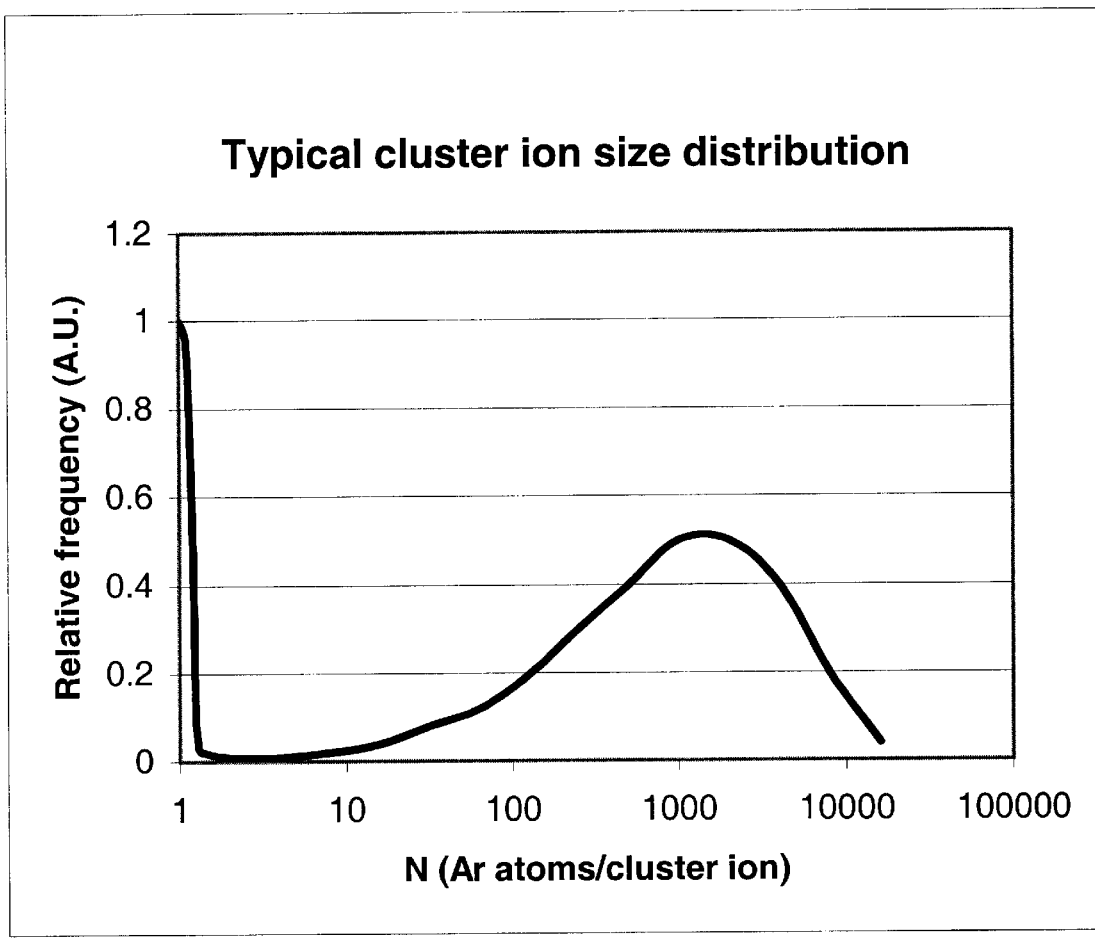
FIG. 1 is a graph showing a typical ion cluster size distribution for a GICB source.

In order to understand better the present invention, the following information is directed toward typical ion cluster size distribution. FIG. 1 shows the typical ion cluster size distribution produced by a typical GICB source. The cluster formation process has been shown by N. Kofuji, et al., in "Development of gas cluster source and its characteristics", *Proc. 14th Symp. on Ion Sources and Ion-Assisted Technology,* Tokyo (1991), p. 15, to produce few small size clusters (values of N from 2 to about 10), but monomer ions (N=1) are produced in abundance as are larger clusters (N>a few tens, up to a few thousands.) It is known (Yamada, U.S. Pat. No. 5,459,326) that such atoms in a cluster are not individually energetic enough (on the order of a few electron volts) to significantly penetrate a surface to cause the residual surface damage typically associated with the other types of ion beam processing in which individual monomer atoms may have energies on the order of thousands of electron volts. Nevertheless, the clusters themselves can be made sufficiently energetic (some thousands of electron volts), to effectively etch, smooth or clean surfaces (see Yamada and Matsuo, in "Cluster ion beam processing", *Matl. Science in Semiconductor Processing I,* (1998), pp 27–41).

Figure 2:
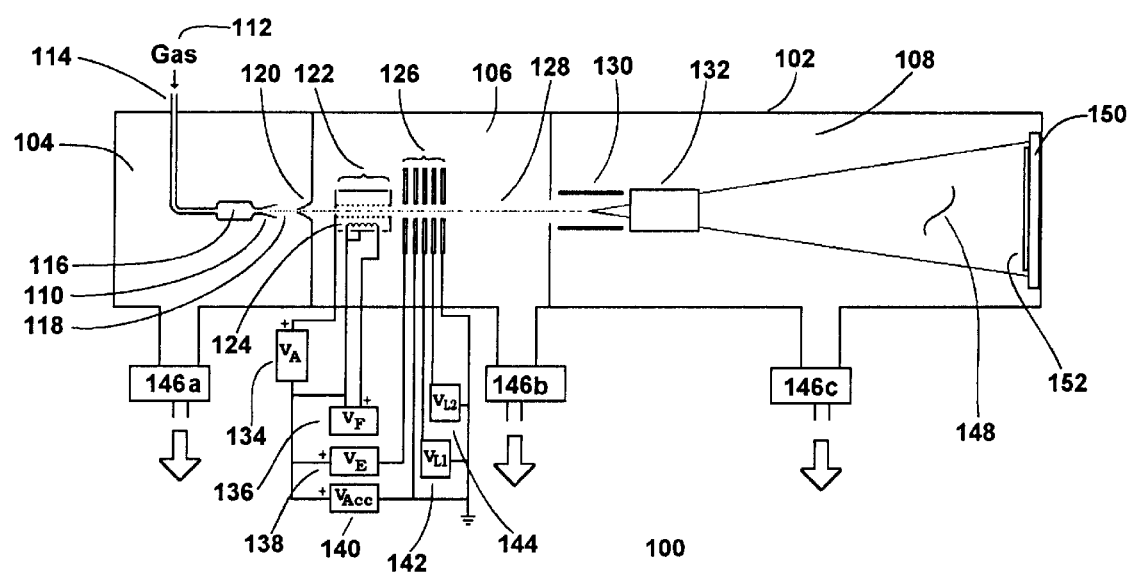
FIG. 2 is a schematic that shows the basic elements of a prior art GCIB processing system.

FIG. 2 shows a typical configuration for a GCIB processor 100 of a form known in prior art, and which may be described as follows. A vacuum vessel 102 is divided into three communicating chambers, a source chamber 104, a ionization/acceleration chamber 106, and a processing chamber 108. The three chambers are evacuated to suitable operating pressures by vacuum pumping systems 146a, 146b, and 146c, respectively. A condensable source gas 112 (for example argon) is admitted under pressure through gas feed tube 114 to stagnation chamber 116 and is ejected into the substantially lower pressure vacuum through a properly shaped nozzle 110. A supersonic gas jet 118 results. Cooling, which results from the expansion in the jet, causes a portion of the gas jet 118 to condense into clusters, each consisting of from several to several thousand weakly bound atoms or molecules. A gas skimmer aperture 120 separates the gas products that have not been formed into a cluster jet from the cluster jet so as to minimize pressure in the downstream regions where such higher pressures would be detrimental (e.g., ionizer 122, high voltage electrodes 126, and process chamber 108). Suitable condensable source gases 112 include, but are not necessarily limited to, argon, nitrogen and other inert gases.

After the supersonic gas jet 118 containing gas clusters has been formed, the clusters are ionized in an ionizer 122. The ionizer 122 is typically an electron impact ionizer that produces thermoelectrons from one or more incandescent filaments 124 and accelerates and directs the electrons causing them to collide with the gas clusters in the gas jet 118, where the jet passes through the ionizer 122. The electron impact ejects electrons from the clusters, causing a portion the clusters to become positively ionized. A set of suitably biased high voltage electrodes 126 extracts the cluster ions from the ionizer, forming a beam, then accelerates them to a desired energy (typically from 1 keV to several tens of keV) and focuses them to form a GCIB 128. Filament power supply 136 provides voltage $V_F$ to heat the ionizer filament 124. Anode power supply 134 provides voltage $V_A$ to accelerate thermoelectrons emitted from filament 124 to cause them to bombard the cluster containing gas jet 118 to produce ions. Extraction power supply 138 provides voltage $V_E$ to bias a high voltage electrode to extract ions from the ionizing region of ionizer 122 and to form a GCIB 128. Accelerator power supply 140 provides voltage $V_{Acc}$ to bias a high voltage electrode with respect to the ionizer 122 so as to result in a total GCIB acceleration energy equal to $V_{Acc}$. One or more lens power supplies (142 and 144 shown for example) may be provided to bias high voltage electrodes with potentials ($V_{L1}$ and $VL_2$ for example) to focus the GCIB 128.

A workpiece 152, which may be a semiconductor wafer or other workpiece to be processed by GCIB processing, is held on a workpiece holder 150, disposed in the path of the GCIB 128. Since most applications contemplate the processing of large workpieces with spatially uniform results, a scanning system is desirable to uniformly scan the GCIB 128 across large areas to produce spatially homogeneous results. Two pairs of orthogonally oriented electrostatic scan plates 130 and 132 can be utilized to produce a raster or other scanning pattern across the desired processing area. When beam scanning is performed, the GCIB 128 is converted into a conical scanned GCIB 148, which scans the entire surface of workpiece 152.

The present invention relies upon the understanding that GICB sources, including the one described in FIG. 1, produce a broad distribution of ion cluster sizes with limited cluster ion currents available. Therefore it is not practical to perform GICB processing by selecting a single cluster size or a narrow range of cluster sizes—the available fluence of such a beam is too low for productive processing. It is preferred to eliminate only the monomer ions and other lowest mass ions from the beam and use all remaining heavier ions for processing. It has been determined by the present invention that it is sufficient to provide filtering to eliminate monomer ions while depending on cluster size distribution characteristics shown in FIG. 1 to limit the small clusters (N=2 to ~10) in the beam. Clusters of size N>10 are adequately large to provide acceptable results in most processes. Since the typical cluster distribution contains clusters of up to N=several thousand and there are few clusters of mass less than 100, it is not significantly detrimental if clusters up to size 100 are removed from the beam in the process of eliminating the monomer ions.

Figure 3:
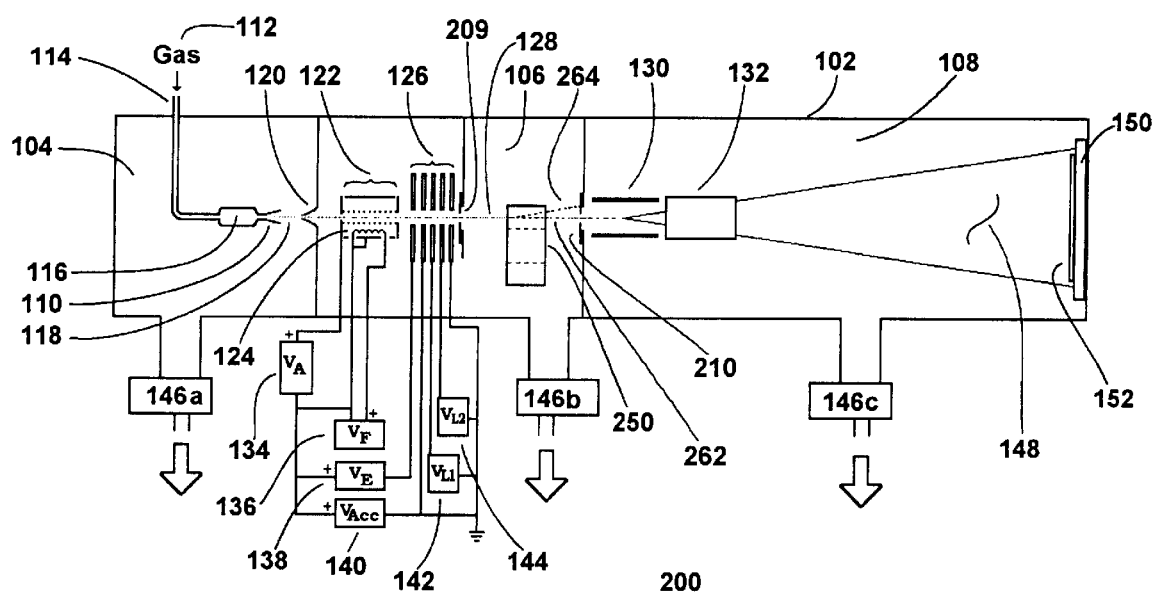
FIG. 3 is a schematic that shows a GCIB processing system of this invention, with dipole magnet following beam formation and acceleration for separating undesired ions from the GCIB.

The present invention further relies upon the understanding that a magnet can be used to provide a magnetic field appropriate for separating monomer ions from a GCIB having a distribution of ion cluster sizes similar to that shown in FIG. 1. FIG. 3 shows GCIB apparatus having such a magnetic beam filter 250 placed in a location after beam formation by high voltage electrodes 126 and before and before beam scanning at electrostatic scan plates 130 and 132. The GCIB 128 containing unwanted monomer ions passes through a magnetic B field between pole faces of permanent magnet assembly 250, where the lighter monomer ions are deflected away from the initial trajectory of GCIB 128. The light monomer ions follow deflected trajectory 264, while the heavy cluster ions are negligibly perturbed and follow trajectory 262, which is substantially the same as the initial trajectory of GCIB 128. The unwanted monomer ions following deflected trajectory 264 strike mass analysis plate 210, which has an aperture to permit passage of the heavy cluster ions following trajectory 262. In order to ensure that the beam trajectories in the magnetic beam filter are predictable, it is important that the entire radial extents of the portions of the GCIB following trajectories 128, 262, and 264 be substantially within the uniform magnetic field region of the magnetic beam filter 250. In some cases it may be desirable to limit the diameter or size of the incoming GCIB 128 in order to assure this condition. In such case, an upstream beam defining aperture 209 may be included to collimate the GCIB 128 prior to entry into the magnetic beam filter 250.

Figure 4:
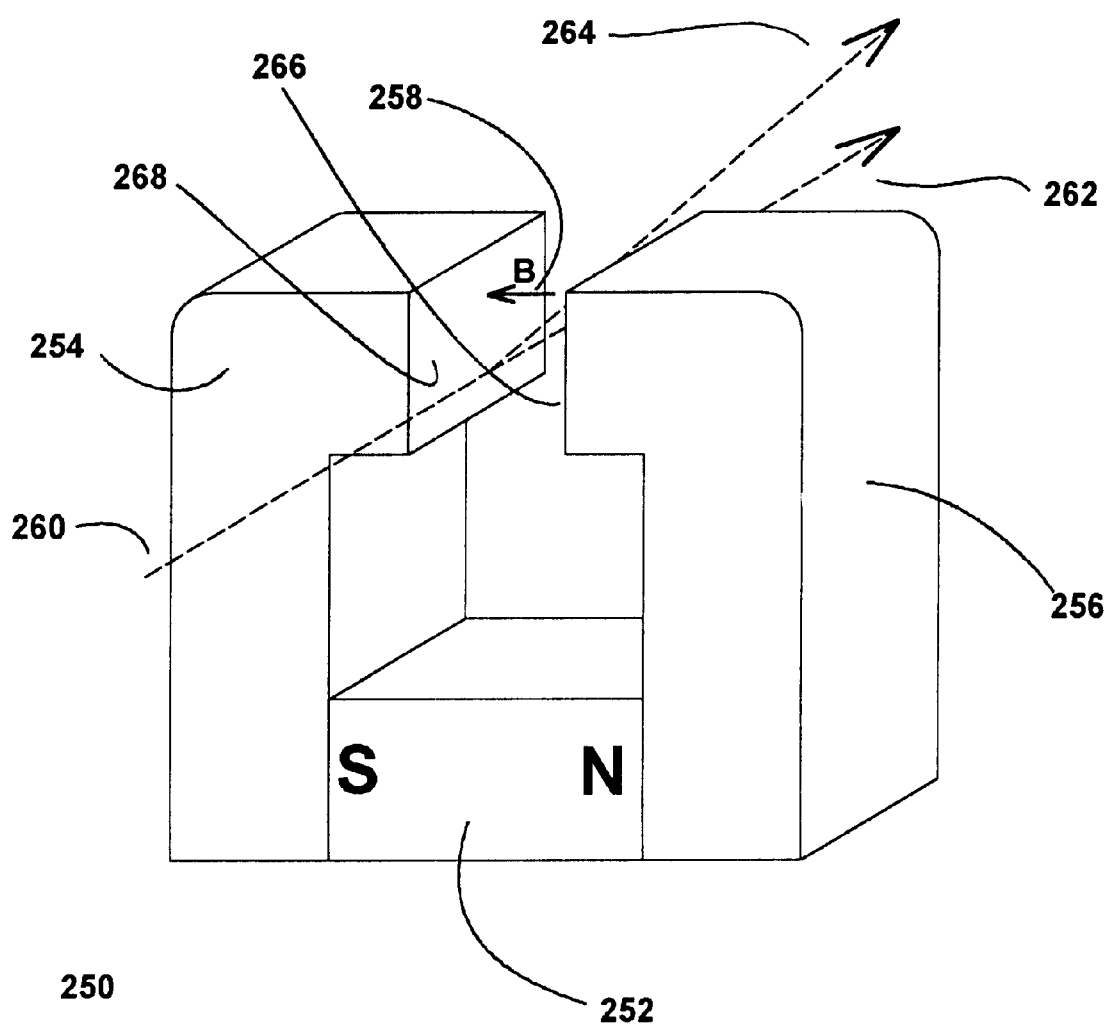
FIG. 4 is a schematic of a permanent dipole magnet for separation of undesired ions from a GCIB with the present invention.

Because effective GCIB processing can be accomplished at energies of 30 keV and lower, and because the monomer ions are typically of relatively low mass, for example AMU 40 for argon, powerful magnetic B fields are not required to effectively separate the monomer ions from the GCIB. Furthermore, since it is acceptable with the present invention to remove other higher mass (N<100) clusters from the GCIB, it is practical to use a fixed magnetic B field. A permanent magnet can be used effectively within the GCIB apparatus of the present invention. FIG. 4 shows detail of a permanent magnet beam filter 250.

More specifically, as shown in FIG. 4, permanent magnet beam filter 250 comprises permanent magnet 252 having north (N) and south (S) poles. Iron pole pieces 254 and 256 are attached to permanent magnet 252 forming a magnetic circuit having a two pole faces 266 and 268 separated by a gap, having within it a magnetic B-field 258 signified by an arrow and the symbol B. Pole face 266 is the north pole face and pole face 268 is the south pole face. The permanent magnet beam filter 250 is disposed such that the GCIB 128 trajectory 260 passes centrally through the gap between pole faces 266 and 268. Light monomer ions are deflected along trajectory 264 and the heavy cluster ions continue substantially unperturbed along trajectory 262 which differs negligibly from trajectory 260. The permanent magnet beam filter 250 does not produce heat.

Figure 5:
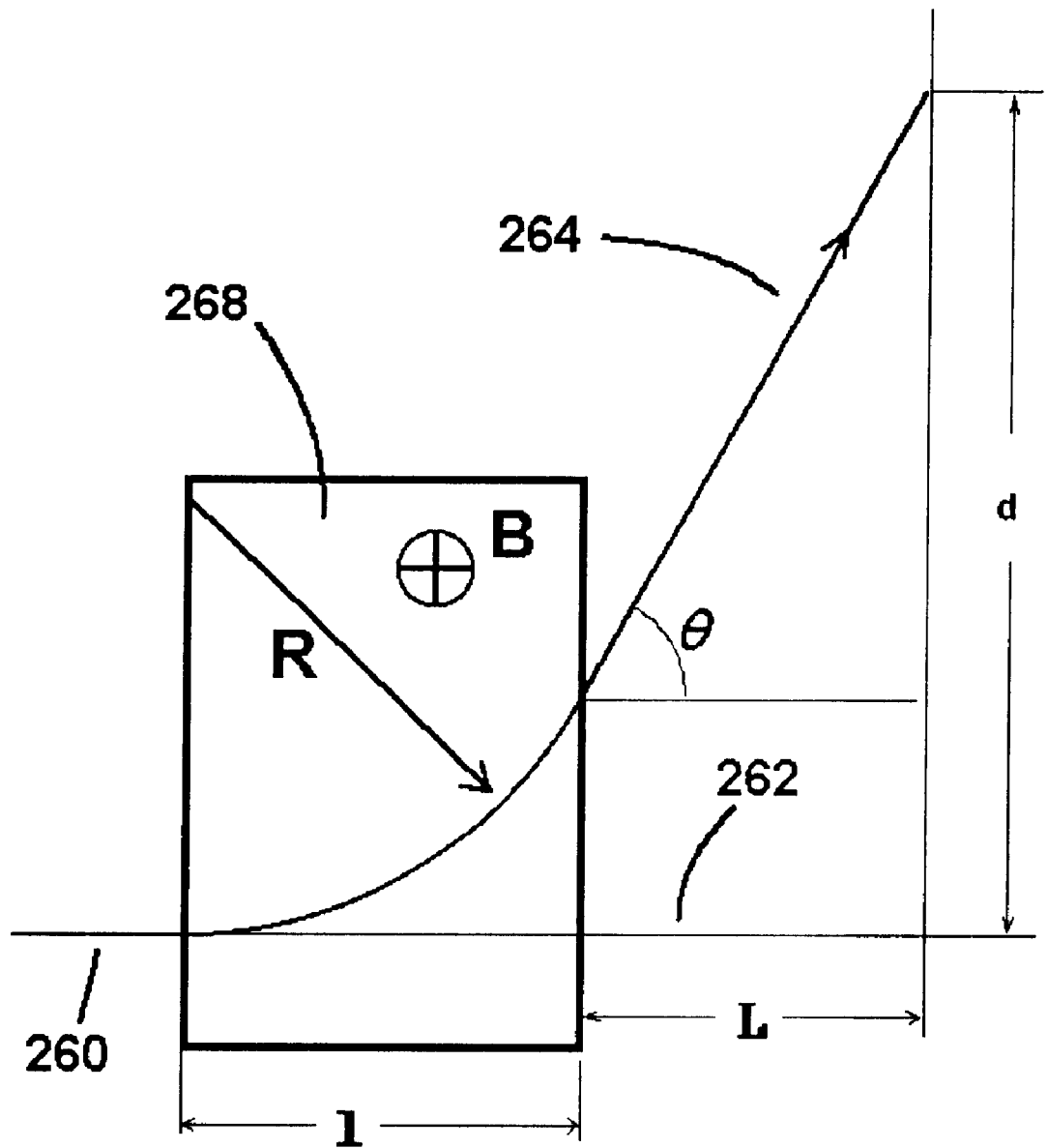
FIG. 5 is a schematic geometric diagram to explain deflection in the magnetic beam filter of this invention.

FIG. 5 shows a diagram to explain the deflection that occurs in such a filter. Referring to FIG. 5, south pole face 268 is seen from the direction of north pole face 266 (not shown). A GCIB enters from the left on initial trajectory 260. The GCIB has an ion size distribution similar to that shown in FIG. 1 and includes positive ion clusters as well as positive monomer ions and is assumed to have been formed and accelerated in the GCIB apparatus of this invention, a type of which is shown in FIG. 3. A magnetic flux (B-field) exists in the gap between the two pole faces and is symbolized by B and the circled cross, which means that the direction of the B-field is into the plane of the paper (from the north pole face to the south pole face). The width of the pole face 268 in the direction of the trajectory 260 is signified by the lower case letter "l". In the magnetic field, which is assumed to be uniform within the gap and zero outside the gap, the positive monomer ions travel in a circular path of radius "R" and exit the magnetic gap along deflected trajectory 264. Heavy cluster ions are not substantially perturbed and exit the magnetic gap along trajectory 262 which is substantially the same as trajectory 260.

Cluster ions having small sizes of N=2, 3, . . . if present, follow trajectories between monomer ion trajectory 264 and heavy cluster trajectory 262. After exiting the magnetic gap and drifting an additional distance "L", the trajectories 264 and 262 are separated by distance "d" referred to as the "deflection" of the monomer ion beam.

$$R = \frac{\sqrt{\frac{2 \cdot m \cdot V}{e}}}{B} \quad \text{Eqn. 1}$$

Equation 1 is the well-known equation of motion of a charged particle, having a single electrical charge, in a magnetic field where:

R is the radius of the circular orbit of the charged particle

B is the magnetic B-field strength m is the mass of the charged particle

V is the energy in electron volts of the charged particle, which for a singly charged ion, equals the total potential, $V_{Acc}$, through which it has been accelerated.

e is the magnitude of the charge of a single electron (charge quantum)

Equation 2 is obtained from the geometry of FIG. 5.

$$\frac{1}{R} = \sin\theta, \quad \text{Eqn. 2}$$

where l is the width of pole face 268

Equation 3 is obtained by solving Eqn. 2 for the deflection angle, θ and substituting Eqn. 1 for R.

$$\theta = a\sin\left[\frac{l \cdot B}{\sqrt{\frac{2 \cdot m \cdot V}{e}}}\right] \quad \text{Eqn. 3}$$

Equation 4 is obtained from the geometry of FIG. 5.

$$d = L \cdot \tan\theta + R - \sqrt{(R^2 - l^2)} \quad \text{Eqn. 4}$$

The total deflection d is the sum of the deflection occurring in the magnet gap and the additional drift after exiting the magnet gap.

Equation 5 results from substituting the expression for θ from Eqn. 3 into Eqn. 4 and simplifying.

$$d = \frac{B \cdot L \cdot l}{\sqrt{\frac{2 \cdot V \cdot m - B^2 \cdot e \cdot l^2}{e}}} + \frac{\sqrt{\left(\frac{2 \cdot V \cdot m}{B}\right)}}{B} - \frac{\sqrt{\frac{2 \cdot V \cdot m - B^2 \cdot e \cdot l^2}{e}}}{B} \quad \text{Eqn. 5}$$

Eqn. 5 gives the total deflection "d" given the magnet and drift geometry and the magnetic B-field strength, neglecting magnetic field fringing effects. By using Eqn. 5 and solving by indirect means it is possible to determine the required value of B, magnetic B-field strength required to produce a desired deflection d in a given geometry and for a specific particle and energy.

Figure 6:
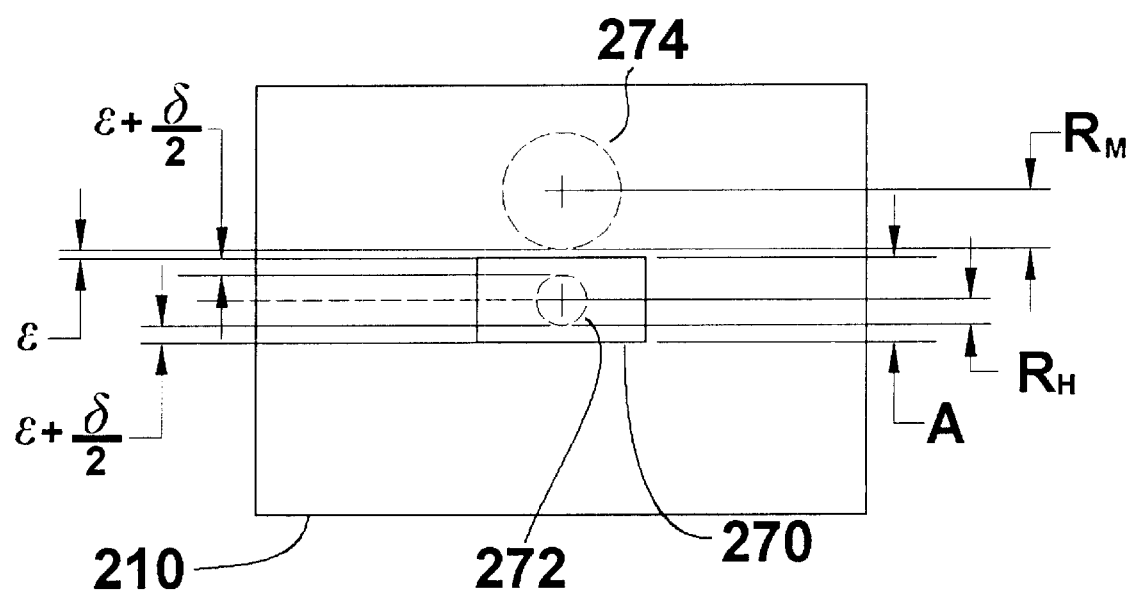
FIG. 6 shows details of the GCIB and mass analysis plate of this invention under nominal beam conditions.

The actual separation of the deflected monomer beam from the desired heavy cluster beam occurs at the mass analysis plate 210. FIG. 6 shows an example mass analysis plate 210 for illustration. Mass analysis plate 210 has a slit-like aperture 270 through which the desired heavy cluster beam trajectory may pass. Because there may be aberrations in the beam forming optics of a GCIB forming system, it is generally the case that in a GCIB containing monomer ions, the beam diameter of the beam of desired heavy cluster ions may be different from the diameter of the beam of co-traveling monomer ions. This is illustrated in FIG. 6 by the fact that the beam spot size 274 of the monomer ion beam where it strikes the plate 210 is different from the spot size 272 of the heavy cluster ion beam where it passes through the plane of the plate 210. The respective beam spot sizes may be measured or determined by mathematical modeling by those skilled in the arts. The addition of upstream beam defining apertures may be employed to control the maximum size of the beam spot sizes.

If the heavy cluster ion beam spot radius is $R_H$ and the monomer ion spot radius is $R_M$, and the maximum misalignment (circular error) of the center of the analysis aperture 270 with respect to the beam is $\epsilon$ then the aperture slit width must be greater than the beam diameter. Additionally, for tolerance reasons, it may desirable to allow an additional amount $\delta$, to the slit width. In such case, the slit width will be:

$$A = 2 R_H + 2\epsilon + \delta \qquad \text{Eqn. 6}$$

and the necessary separation between the centers of the monomer and heavy beam spots to assure complete separation under worst case alignment conditions is:

$$d = R_H + 2\epsilon + \delta/2 + R_M \qquad \text{Eqn. 7}$$

Figure 7:
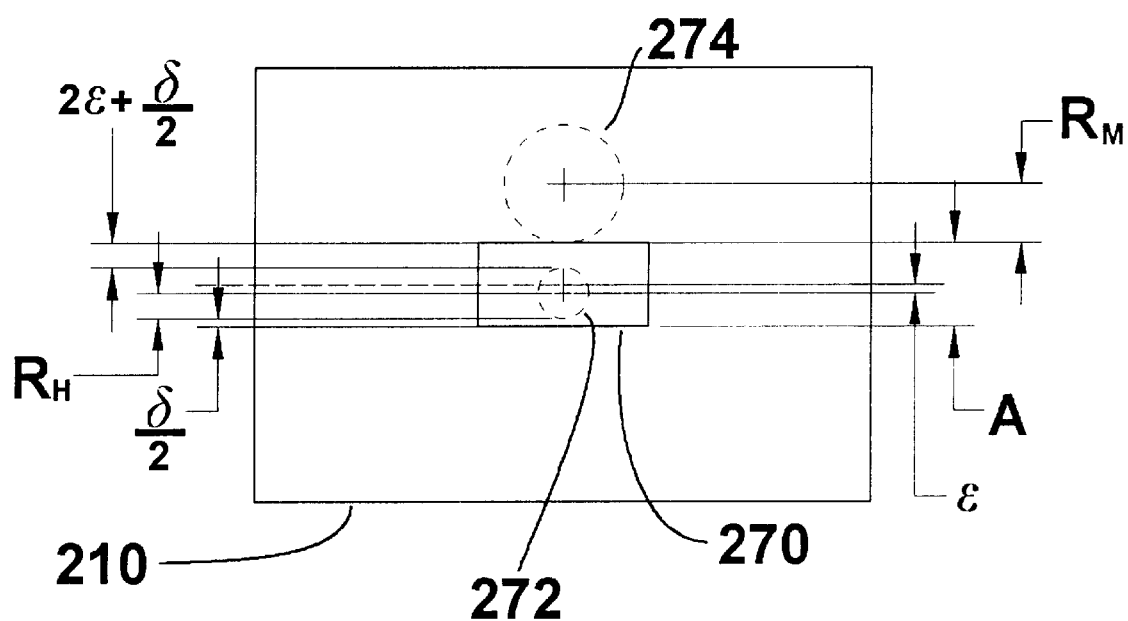
FIG. 7 shows details of the GCIB and the mass analysis plate of this invention under worst case beam alignment conditions.

FIGS. 6 and 7 shows the geometry for beam separation with slit width A and beam deflection d designed according to Equations 6 and 7 in the case (FIG. 6) where there is no misalignment of the beam to the aperture, and in the case (FIG. 7) where there is worst case misalignment.

As an example case, consider the GCIB processor of apparatus 200 shown in FIG. 3, wherein the permanent magnet beam filter 250 has a pole face width, l=2" and the drift distance L from the magnet 250 to the mass analysis plate 210 is 8". The monomer spot size 274 is 0.7" and the heavy cluster ion beam spot size 272 is 0.3". Alignment error, $\epsilon$ is 0.05" and we choose $\delta$ to be 0.1". We have:

l=2"

L=8"

$R_M$=0.35"

Figure 8:
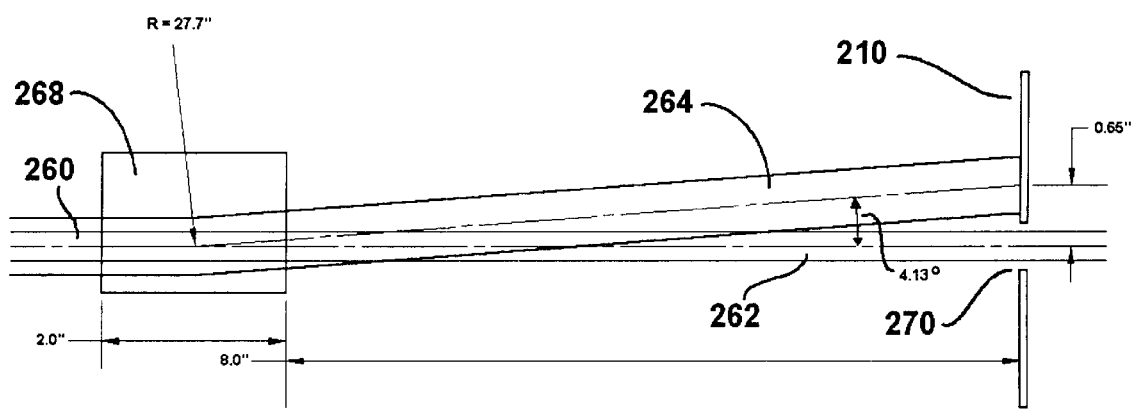
FIG. 8 is a schematic geometric diagram showing GCIB beamlet separation in an example case of this invention.

$R_H$=0.15"

from Eqn. 6: A=0.5"

from Eqn. 7: d=0.65"

the beam is a 30 keV argon GCIB having zero alignment error from Eqn. 5:, solving implicitly, given d B≈0.2237 tesla=2237 gauss and the trajectories of the monomer and heavy cluster ion beamlets are as shown in FIG. 8.

The monomer beamlet is deflected by approximately 4.13° from the heavy cluster ion beamlet. All of the heavy cluster beamlet, following trajectory 262 passes through the slit 270 in the mass analysis plate 210, while all of the monomer ion beamlet, following trajectory 264 strikes the mass analysis plate 210.

A problem, however, may still, under certain circumstances, exist with the use of a permanent magnet beam filter for separation of monomer ions from a GCIB. Occasionally, for beam diagnostic purposes, it may be desirable to transmit the entire beam including any monomer ions present (for example to determine the ratio of monomer ions to cluster ions for the source, as may be required to tune the source to minimize the production of monomer ions). In such case, it is desirable to remove the beam filter effect, but because of the permanent magnet nature of the filter this will only be straightforwardly achieved by removal of the entire beam filter from the system, which is not a practical method from a point of maintenance effort and equipment availability.

Figure 9:
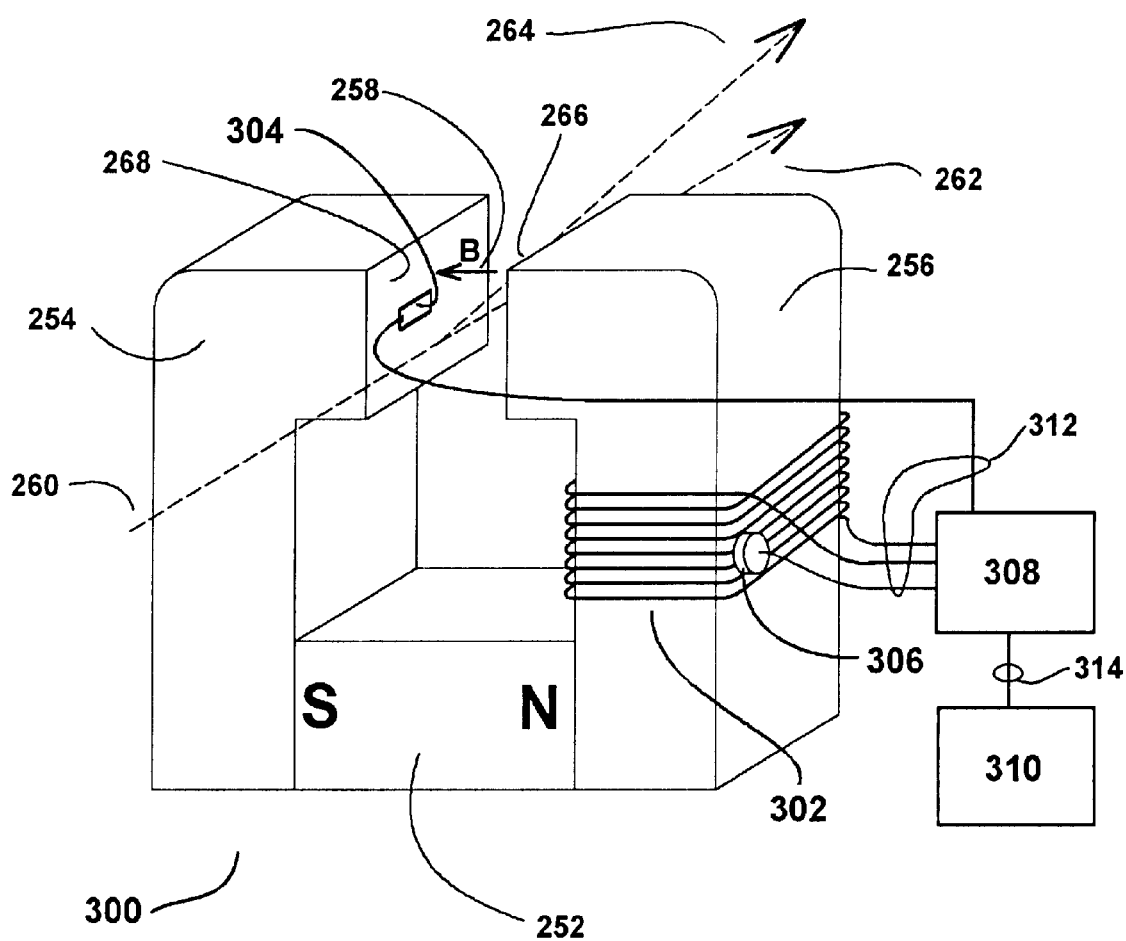
FIG. 9 is a schematic of a hybrid permanent/electromagnetic GCIB beam filter for use with the present invention.

A further embodiment of this invention is directed to the above problem. In this embodiment of this invention a novel combination of permanent magnet and electromagnet is incorporated within the GCIB apparatus 200 shown in FIG. 3. FIG. 9 shows a hybrid permanent/electromagnetic beam filter 300, made by adding an exciting coil to the permanent magnet beam filter 250 described in FIG. 4. Specifically, permanent/electromagnetic beam filter 300 comprises a permanent magnet 252 having north (N) and south (S) poles. Iron pole pieces 254 and 256 are attached to permanent magnet 252 forming a magnetic circuit having a two pole faces 266 and 268 separated by a gap, having within it a magnetic B-field 258 signified by an arrow and the symbol B. Pole face 266 is the north pole face and pole face 268 is the south pole face. The permanent/electromagnetic beam filter 300 is disposed such that the GCIB 128 trajectory 260 passes centrally through the gap between pole faces 266 and 268. Light monomer ions are deflected along trajectory 264 and the heavy cluster ions continue substantially unperturbed along trajectory 262 which differs negligibly from trajectory 260. Permanent magnet 252 is chosen to have a magnetic strength at least great enough to produce a B-field 258 in the gap that is large enough to provide a desired minimum deflection of light monomer ions trajectory 264 from the heavy cluster ions trajectory 262 sufficient to separate the monomer ions from the transmitted beam of heavy cluster ions under conditions of maximum beam energy and for the heaviest monomer ions that will be used (for example argon, AMU 40), and under conditions of worst case beam alignment. Permanent/electromagnetic beam filter 300 also has an electrical excitation coil 302, which can be energized by power supply/controller 308 to provide an electromagnetic B-field to oppose and counteract the permanent magnet produced B-field in the gap, thus rendering the gap B-field 258 substantially equal to zero, during the time while the coil 302 is thus suitably energized. The characteristics of the coil and power source are chosen to provide sufficient ampere-turns to produce a B-field 258 in the gap which is at least greater than that provided by the permanent magnet 252. The method of calculating the proper number of ampere-turns to produce a desired B-field is well known and may be found in various references including M. S. Livingston, et al., *Particle Accelerators*, p. 242, eqn. (8-5), McGraw-Hill, New York (1962). When the coil 302 is not energized, the permanent magnet 252 provides the predetermined B-field 258 in the gap, and when the coil 302 is suitably energized, the B-field 258 in the gap is zero. When the coil 302 is not energized, the permanent/electromagnetic beam filter 300 does not produce heat.

To facilitate adjustment of the gap B-field 258 to zero value, a magnetic field sensor 304 may be disposed in the gap to measure the gap B-field 258. Such a sensor may be a small Hall-effect sensing device and is so disposed as to sense the B-field 258 without interfering with the transmission of the GCIB through the magnet gap.

During the time the coil 302 is energized to disable the beam filter, resistive heating heats coil 302. The coil 302 may be encapsulated and may be in thermal contact with the magnet pole piece 256 and heat produced by the coil may be conducted into the encapsulation and pole piece to allow short periods of operation without excessive temperature rise due to the combined heat capacity of coil, encapsulation, and pole pieces. As a safety measure, temperature sensor 306, which may be a bi-metallic thermostat, a thermistor, a thermocouple, or the like, may be attached to the coil 302 and connected by cable 312 to power supply/controller 308. Signals from temperature sensor 306 are used by power supply/controller 308 to shut down the coils 302, in the event that an excessive temperature rise is detected in coil 302.

Figure 10:
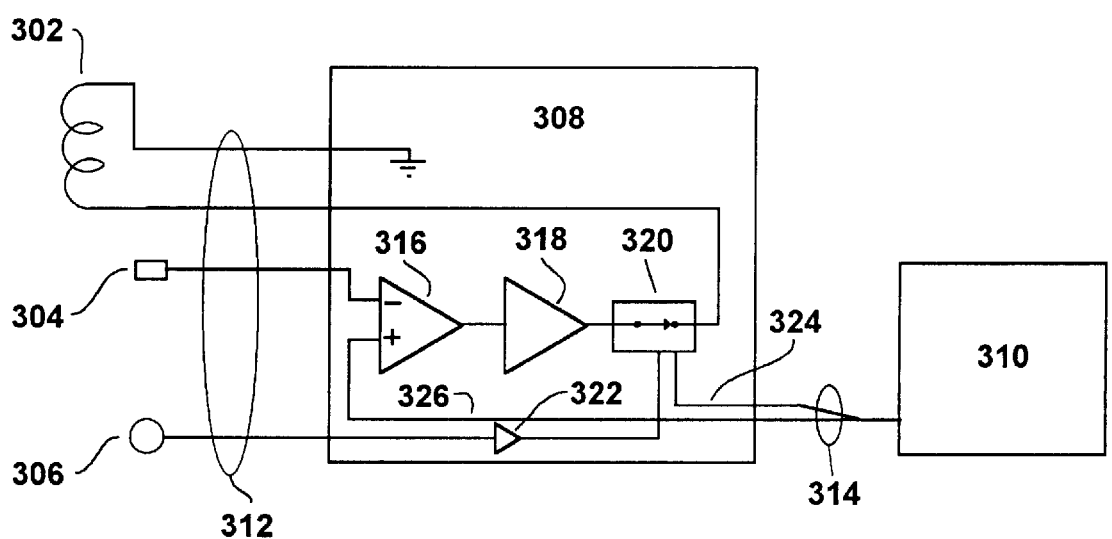
FIG. 10 is a schematic diagram of controls for the hybrid permanent/electromagnetic GCIB beam filter of this invention.

FIG. 10 shows details of the controls for the hybrid permanent/electromagnetic beam filter. Cable 312 connects power supply/controller 308 to coil 302, magnetic field sensor 304, and temperature sensor 306. Operation is as follows: a system control device 310 which may be a small computer or microcomputer provides a magnetic B-field set-point signal 326 corresponding to zero magnetic B-field and power supply enabling signal 324 to power supply/controller 308. Signals 324 and 326 are connected through cable 314. When power supply enabling signal 324 does not enable power supply/controller 308, switch device 320 disconnects coil 302 from power amplifier 318, de-energizing coil 302.

When power supply enabling signal 324 enables power supply/controller 308, switch device 320 connects coil 302 to the output of power amplifier 318, energizing coil 302. Set-point signal 326 is compared to the signal from magnetic field sensor 304 at error amplifier 316, producing an error signal which drives power amplifier 318 to deliver current through switch device 320 to coil 302. Current in the coil 302 increases until feedback from magnetic field sensor 304 compares with the zero field set-point signal 326, and regulates the B-field in the magnet gap to zero. System control device 310 limits the duty cycle of enabling power supply/controller 308 to a predetermined value that does not produce excessive heating of coil 302.

Temperature sensor 306 monitors coil temperature as a protective measure against system control device failure. If temperature sensor detects a coil over-temperature condition, it overrides control inputs to switch device 320, shutting down power to coil 302. If temperature sensor 306 is a low level analog device such as a thermistor or thermocouple, amplifier 322 may be employed to create a control level signal for switch device 320 from the low level sensor signal.

Figure 11:
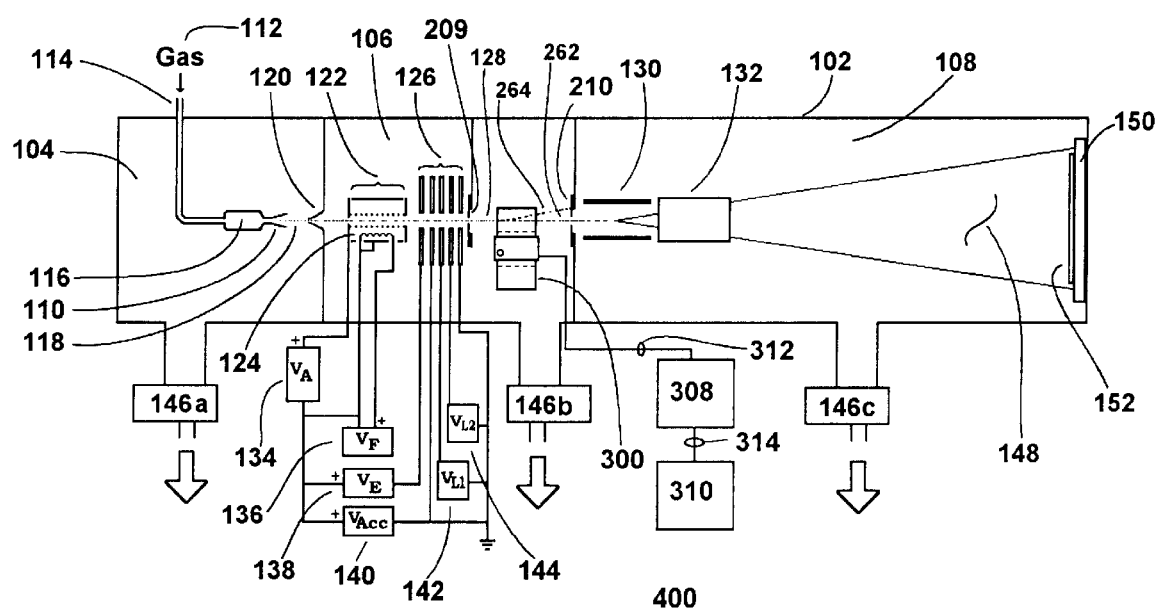
FIG. 11 is a schematic of the GCIB processing system of this invention employing the hybrid beam filter invention.

FIG. 11 shows the GCIB processing system or apparatus 400 of this invention with the hybrid permanent/electromagnetic beam filter invention. During normal beam operation of the GCIB processing device, system control device 310 does not enable the coil 302 and the hybrid permanent/electromagnetic beam filter 300 filters low mass monomer ions from the beam by virtue of it's permanent magnetic B-field. During periods of beam diagnostic tests, the system control device 310, enables the power supply control device 308 and sets current in the electromagnet coil 302 to zero the field in the magnet gap, disabling the beam filter and permitting the entire GCIB including monomer ions, if present, to be transmitted through the system. During normal beam processing, no heat is generated in the beam filter. During diagnostic testing, heat is generated in the beam filter but is limited to a safe duty cycle.

Although the invention has been described with respect to various embodiments, it should be realized this invention is also capable of a wide variety of further and other embodiments within the spirit and scope of the appended claims.

What is claimed is:

1. The gas cluster ion beam apparatus for processing a workpiece, said apparatus comprising a means for separating undesired ions having a hybrid magnet within said vacuum vessel with:

a permanent magnet located having a gap with a B-field through which said gas cluster ion beam travels; and an electrical excitation coil located within said vacuum vessel and energizable to reduce said B-field substantially to zero.

2. The gas cluster ion beam apparatus of claim 1, further comprising:

power supply means for energizing said electrical excitation coil;

magnetic field sensing means for sensing the magnitude of said B-field; and control means for controlling said power supply means to reduce said B-field to substantially zero.

3. The gas cluster ion beam apparatus of claim 1, further comprising:

power supply means for energizing said electrical excitation coil;

temperature sensing means for sensing the temperature of said excitation coil; and control means for controlling said power supply means to prevent excessive heating of said electrical excitation coil.

4. The gas cluster ion beam apparatus of claim 1, wherein said means for separating undesired ions further comprises a mass analysis plate having an aperture.

5. The gas cluster ion beam apparatus of claim 2, wherein said means for separating undesired ions further comprises a mass analysis plate having an aperture.

6. The gas cluster ion beam apparatus of claim 3, wherein said means for separating undesired ions further comprises a mass analysis plate having an aperture.

7. The gas cluster ion beam apparatus of claim 4, wherein said means for separating undesired ions further comprises a beam defining aperture upstream of said gap.

8. The gas cluster ion beam apparatus of claim 5, wherein said means for separating undesired ions further comprises a beam defining aperture upstream of said gap.

9. The gas cluster ion beam apparatus of claim 6, wherein said means for separating undesired ions further comprises a beam defining aperture upstream of said gap.

10. A method for switchably separating undesired ions from a gas cluster ion beam used for processing a workpiece, said method comprising the steps of:

disposing the workpiece in a vacuum vessel for processing;

generating a gas cluster ion beam within said vacuum vessel;

directing said gas cluster ion beam in a first direction to irradiate the workpiece;

utilizing a hybrid permanent/electro-magnet having a gap with a B-field so that said gas cluster ion beam passes through said gap in a direction substantially perpendicular to said B-field; and also comprising an electrical excitation coil located within said vacuum vessel and energizable to reduce said B-field substantially to zero; said B-field controllably deflecting said undesired ions an amount sufficient to permit their separation from the gas cluster ion beam, while leaving the gas cluster ion beam substantially undeflected; and preventing said undesired ions from irradiating the workpiece.

* * * * *